(12) United States Patent
Liang et al.

(10) Patent No.: US 9,089,058 B2
(45) Date of Patent: Jul. 21, 2015

(54) ELECTRONIC DEVICE WITH LATCHING BUMPER, LATCHING BUMPER THEREOF, AND STACKABLE ELECTRONIC DEVICE SYSTEM

(71) Applicant: WISTRON CORP., New Taipei (TW)

(72) Inventors: Jyun-Shuo Liang, New Taipei (TW); Hung-Li Chen, New Taipei (TW)

(73) Assignee: WISTRON CORP., New Taipei (TW)

( * ) Notice: Subject to any disclaimer, the term of this patent is extended or adjusted under 35 U.S.C. 154(b) by 87 days.

(21) Appl. No.: 14/156,994

(22) Filed: Jan. 16, 2014

(65) Prior Publication Data
US 2014/0285954 A1 Sep. 25, 2014

(30) Foreign Application Priority Data
Mar. 20, 2013 (TW) .............................. 102109869 A

(51) Int. Cl.
*H05K 7/00* (2006.01)
*H05K 7/02* (2006.01)

(52) U.S. Cl.
CPC ...................................... *H05K 7/023* (2013.01)

(58) Field of Classification Search
CPC combination set(s) only.
See application file for complete search history.

(56) References Cited

U.S. PATENT DOCUMENTS

| | | | |
|---|---|---|---|
| 3,340,439 A * | 9/1967 | Leo Yeager Marvin et al. | 361/790 |
| 5,402,308 A * | 3/1995 | Koyanagi et al. | 361/679.34 |
| 5,568,361 A * | 10/1996 | Ward et al. | 361/735 |
| 5,691,885 A * | 11/1997 | Ward et al. | 361/735 |
| 6,567,275 B1 * | 5/2003 | Hou et al. | 361/807 |
| 7,242,589 B1 | 7/2007 | Cheng et al. | |
| 7,529,096 B2 | 5/2009 | Lin et al. | |
| 7,602,603 B2 | 10/2009 | Cheng et al. | |
| 7,633,750 B2 | 12/2009 | Fan et al. | |
| 7,815,264 B2 | 10/2010 | Lin et al. | |
| 8,300,389 B2 * | 10/2012 | Kang et al. | 361/679.01 |
| 2006/0234560 A1 * | 10/2006 | Farnworth et al. | 439/632 |
| 2008/0304241 A1 * | 12/2008 | Pasveer et al. | 361/735 |
| 2009/0141458 A1 * | 6/2009 | Liu et al. | 361/728 |
| 2013/0279121 A1 * | 10/2013 | Lin et al. | 361/737 |

FOREIGN PATENT DOCUMENTS

TW I306550 2/2009
TW 201132103 A1 9/2011

OTHER PUBLICATIONS

Taiwan Patent Office, Office action issued on Jan. 27, 2015.

* cited by examiner

*Primary Examiner* — Lisa Lea Edmonds
(74) *Attorney, Agent, or Firm* — Li & Cai Intellectual Property (USA) Office

(57) ABSTRACT

A stackable electronic device with latching bumper includes a housing, an electrical connector, a latching mechanism having a linking module, a latching module and a button. The housing has a bottom board, a side board formed with a button hole, and a bumper disposed on the bottom board formed with a latching hole. The linking module is disposed on an inner side of the side board, and has a first end extended into the button hole and a second end extended into the bumper. The latching module is movably disposed in the bumper between a locking position and an unlocking position. The second end is connected to the latching module. The button can be pressed for driving the first end to move the second end corresponding to the locking position and the unlocking position. The present disclosure also provides a stackable electronic device system.

24 Claims, 9 Drawing Sheets

_(Page 1 of US 9,089,058 B2)_

ELECTRONIC DEVICE WITH LATCHING BUMPER, LATCHING BUMPER THEREOF, AND STACKABLE ELECTRONIC DEVICE SYSTEM

BACKGROUND OF THE DISCLOSURE

1. Field of the Disclosure

The present disclosure relates to an electronic device with latching bumper, latching bumper thereof, and a stackable electronic device system; in particular, to an electronic device which can be stacked and latch onto another electronic device by using latching bumpers.

2. Description of Related Art

Regarding methods of expanding electronic devices, prior art includes U.S. Pat. No. 7,602,603 "STACKABLE MODULAR COMPUTER HOUSING, AND COMPUTER DEVICE INCLUDING THE SAME," which corresponds to TW 1306550. The disclosure provides a method of expanding electronic devices by stacking.

Taking for example TV boxes and game consoles, they also use docking connectors for connecting by stacking. However, most docking connectors do not have latching mechanisms. Additionally, if the TV box or the game console does not have hot swap, the system can be damaged or shut down when the electronic device is accidentally picked up or bumped against.

Moreover, the aesthetics of electronic devices are becoming ever more important, and preferable latching mechanisms do not affect the appearance of electronic devices.

Hence, the present inventor believes the above mentioned disadvantages can be overcome, and through devoted research combined with application of theory, finally proposes the present disclosure which has a reasonable design and effectively improves upon the above mentioned disadvantages.

SUMMARY OF THE DISCLOSURE

The object of the present disclosure is to provide an electronic device having a latching bumper, a latching bumper thereof, and a stackable electronic device system, such that the electronic device can latch onto another electronic device without accidentally detaching from each other and without affecting the outward aesthetics of the electronic devices.

In order to achieve the aforementioned objects, according to an embodiment of the present disclosure, an electronic device having a latching bumper is provided, comprising a housing and a latching mechanism. The latching mechanism includes a linking module, a latching module and a button. The housing has a bottom board, a side board connected to the bottom board, and a bumper disposed on the bottom board. The side board is formed with a button hole. The bumper is formed with a latching hole. The linking module is disposed an inner side of the side board, and has a first end extended into the button hole and a second end extended to the bumper. The latching module is disposed in the bumper, and is movably positioned between a locking position protruding from the latching hole and an unlocking position drawn into the bumper. The other end of the linking module is connected to the latching module. The button can be pressed and is disposed in the button hole, driving the first end of the linking module to move the second end of the linking module, corresponding to the locking position and the unlocking position of the latching module.

In order to achieve the aforementioned objects, according to an embodiment of the present disclosure, a latching bumper is provided and disposed inside the housing of an electronic device. The housing has a side board. The latching bumper includes a bumper formed with a latching hole, and a latching mechanism. The latching mechanism has a linking module, and a latching module disposed in the bumper. The linking module has a first end extending to the side board, a second end extending to the bumper, and a button which can be pressed and is disposed on the side board. The latching module is movably positioned between a locking position protruding from the latching hole and an unlocking position drawn into the bumper. The second end of the latching module is connected to the latching module. The button drives the first end of the linking module to move the second end of the linking module, corresponding to the locking position and the unlocking position of the latching module.

In order to achieve the aforementioned objects, according to an embodiment of the present disclosure, a stackable electronic device system is provided, comprising a first electronic device and at least one second electronic device. The first electronic device includes a housing, an electrical connector disposed on the top of the housing, at least one bumper disposed on the bottom of the housing, and at least one latching mechanism disposed in the housing and extending into the bumper. Each of the bumpers is formed with a latching hole. The at least one latching mechanism includes a linking module, a latching module, and a button. The linking module is disposed in the housing and has a first end proximal to the housing and a second end extending to the bumper. The latching module is disposed in the bumper, and is movably positioned between a locking position protruding from the latching hole and an unlocking position drawn into the bumper. The second end of the linking module is connected to the latching module. The button can be pressed and is disposed on the housing, driving the first end of the linking module to move the second end of the linking module, corresponding to the locking position and the unlocking position of the latching module. The second electronic device includes a housing, a dock disposed on the top of the housing, at least one latching depression disposed on the top of the housing, and at least one bumper disposed on the bottom of the housing. Each of the latching depression is formed with an engagement hole. The latching mechanism of the first electronic device can be selectively protruding from the latching hole, and latched onto the engagement hole of the latching depression.

The present disclosure not only provides a latching function for the electronic device, but also prevents improper detachment from the electronic device below and the resulting electrical disconnection. Additionally, the present disclosure hides the latching mechanism within the bumper, reducing the effect on outward aesthetics.

In order to further the understanding regarding the present disclosure, the following embodiments are provided along with illustrations to facilitate the disclosure of the present disclosure.

DETAILED DESCRIPTION OF THE PREFERRED EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

First Embodiment

Figure 1:
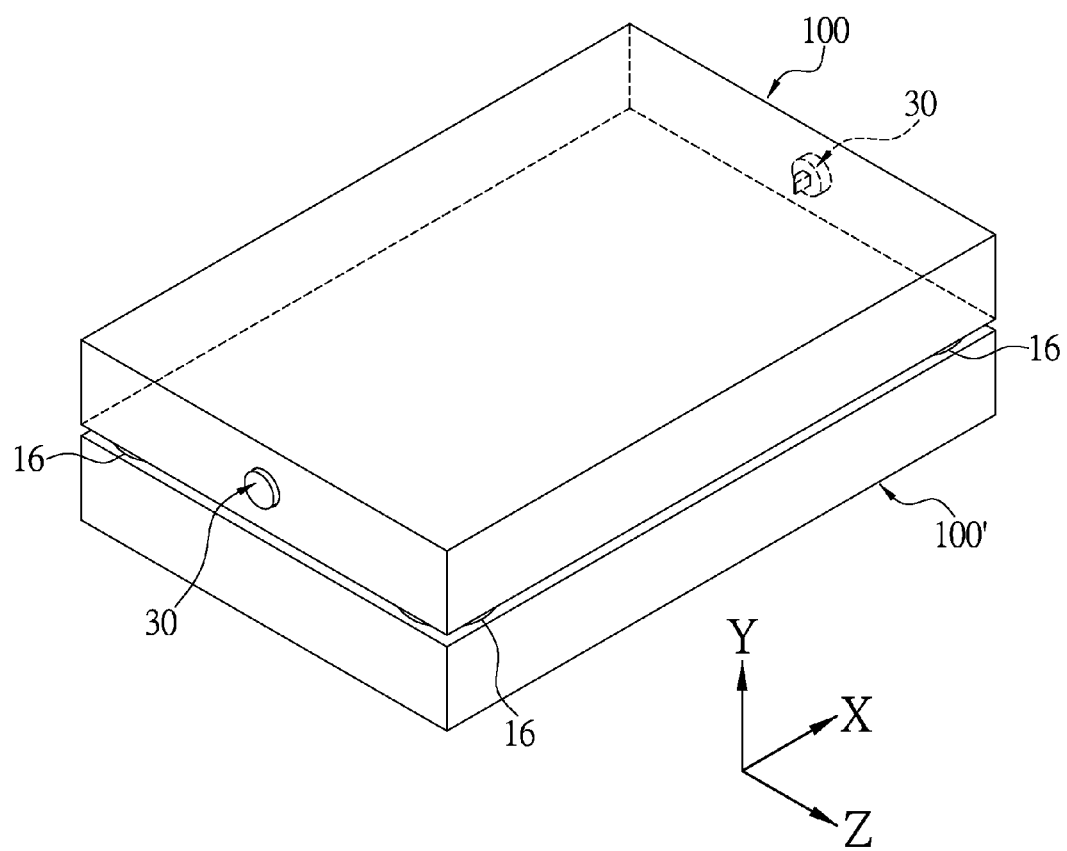
FIG. 1 shows a perspective view of an electronic device with a latching bumper stacked on another electronic device according to the present disclosure.
Figure 2:
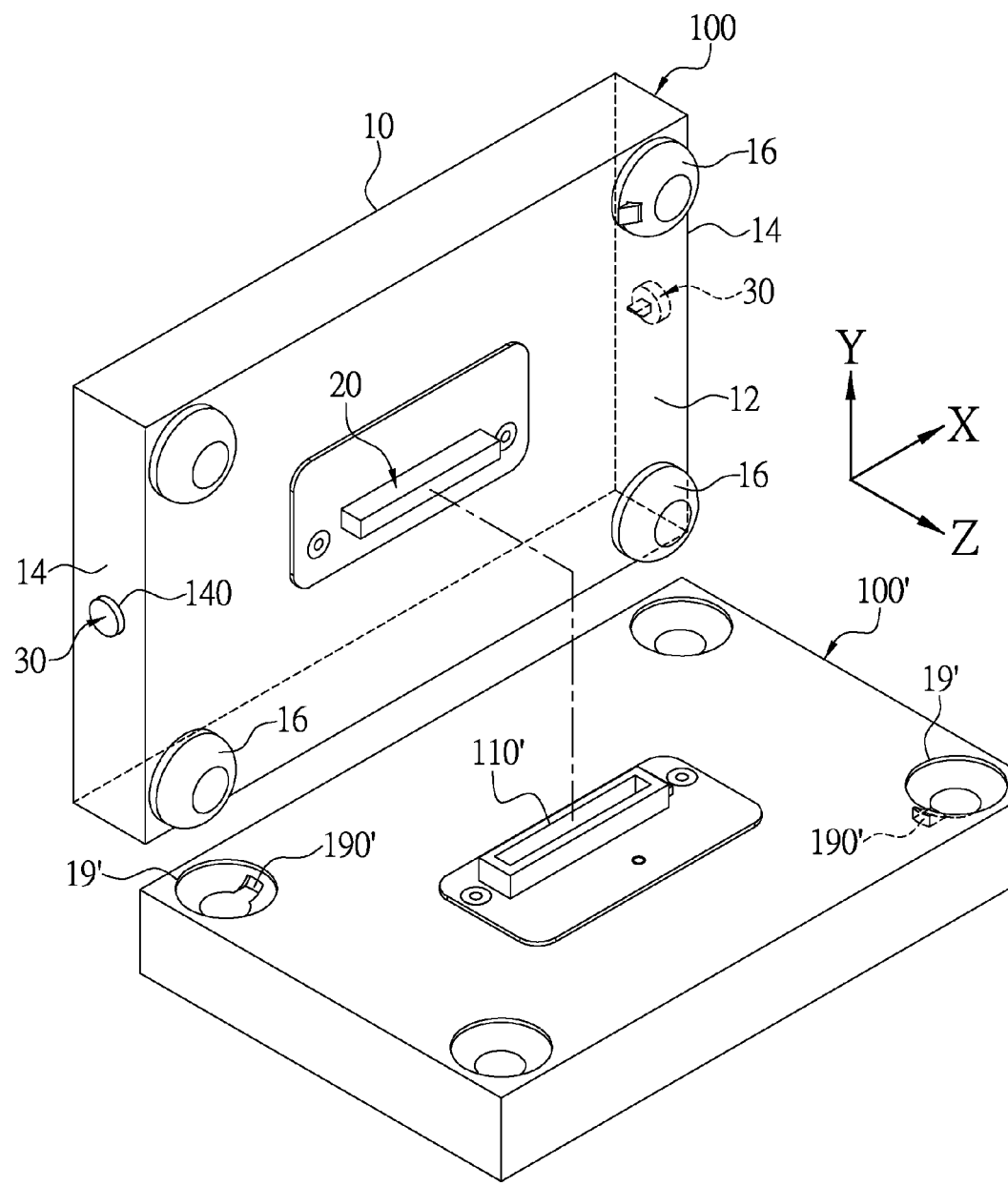
FIG. 2 shows an electronic device with a latching bumper and another electronic device in a separate state according to the present disclosure.

FIG. 1 and FIG. 2 are diagrams of an electronic device 100 with a latching bumper and another electronic device 100' according to the present disclosure in respectively a stacked state and a separate state. The present disclosure provides an electronic device 100 with a latching bumper, alternately named as the first electronic device 100, which can be stacked on another electronic device 100', alternately named as the second electronic device 100'. The electronic device 100 of the present disclosure includes a housing 10, an electrical connector 20, a latching mechanism 30 for latching the electronic device 100 onto the second electronic device 100'. The top surface of the second electronic device 100' has a dock 110' for mating with the electrical connector 20.

The housing 10 of the present embodiment is overall rectangular, has a bottom board 12, a plurality of side boards 14 connected to the bottom board 12, and four bumpers 16 disposed on the bottom board 12. The bottom board 12 is formed with four bumper holes 120 corresponding to the bumpers 16, for allowing the latching mechanism 30 to be extended into the bumpers 16. A button hole 140 is formed on each of two side boards 14 opposite each other. The button holes 140 of the present embodiment are disposed at middle positions of the side boards 14. The present embodiment has a pair of latching mechanisms 30 respectively disposed at the inner sides of two side boards 14 and respectively extending into two bumpers 16 on opposite corners. As shown in FIG. 2, the two latching mechanisms 30 respectively extend into the bumpers 16 at the upper right and the lower left corners. The distance between the two side boards 14 can be designed to allow the user to hold with one hand, such that they can be pressed together by the user to open the latching mechanisms 30 to unlock the electronic device 100 from the second electronic device 100'. In other words, taking into account the form of the hand when designing the user interface, buttons 32 are positioned on two sides of the electronic device 100 such that when the electronic device is held, the buttons 32 can be pressed to achieve unlocking, allowing the electronic device 100 to be lifted up in a successive motion.

The bumpers 16 are each formed with a latching hole 160. Four latching depressions 19' corresponding to the four bumpers 16 are disposed on the top surface of the second electronic device 100'. Each of the latching depressions 19' is formed with an engagement hole 190'. The latching mechanism partially protrudes from the latching hole 160 to latch to the latching depression 19' of the second electronic device 100'. The four bumpers 16 of the present embodiment are respectively disposed at the four corners of the bottom board 12. The electrical connector 20 is disposed in the housing 10 and exposed at the bottom board 12.

Figure 3:
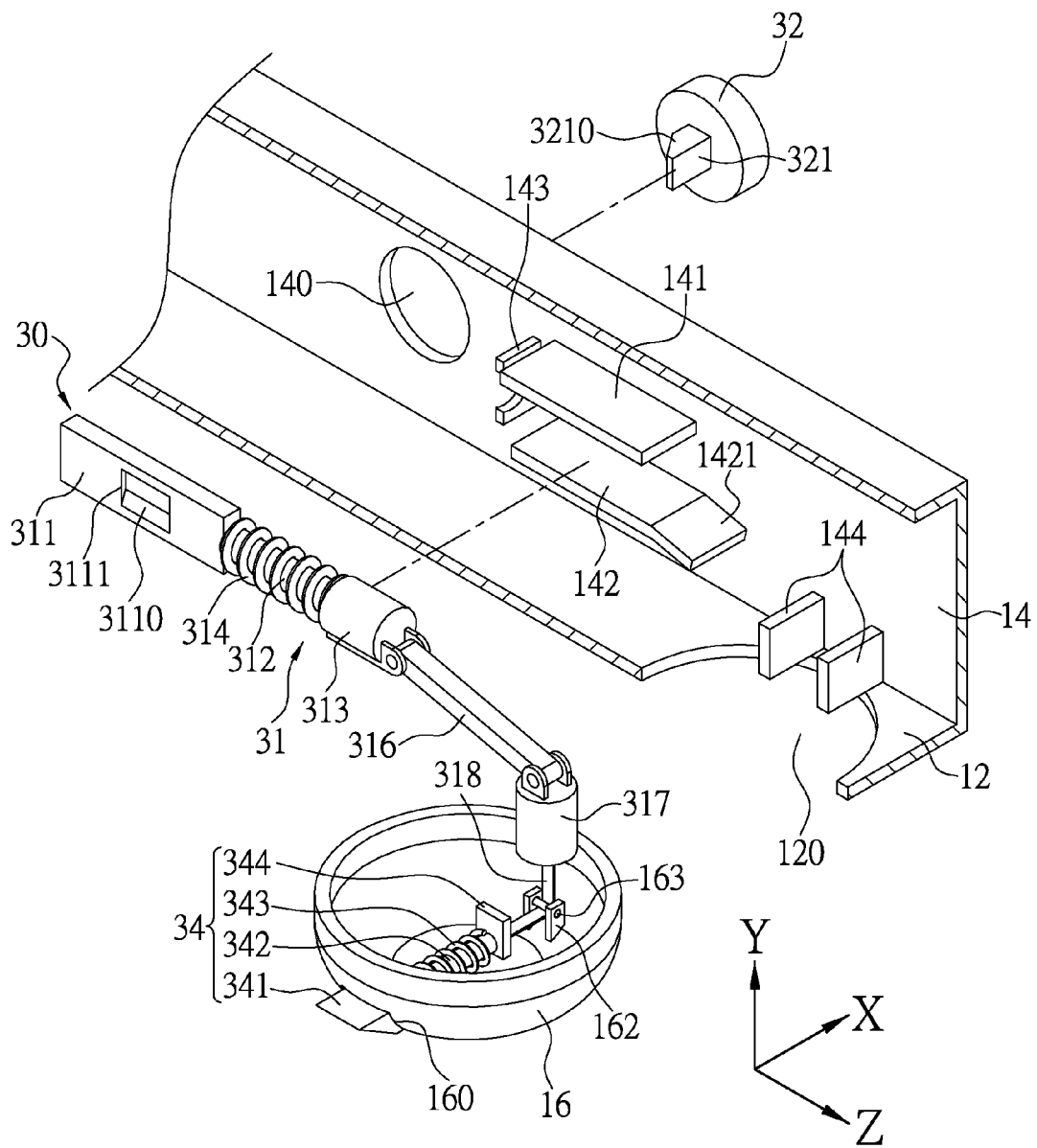
FIG. 3 shows a partial exploded perspective view of an electronic device with a latching bumper according to the first embodiment of the present disclosure.

FIG. 3 shows a partial exploded perspective view of an electronic device with a latching bumper according to the present disclosure. The latching mechanism 30 includes a linking module 31, a button 32 and a latching module 34.

The linking module 31 is disposed on an inner side of the side board 14, and has a first end (the part labeled by 311 in FIG. 3) extending to the button hole 140 and a second end (the part labeled by 318 in FIG. 3) extending into the bumper 16. The latching module 34 is movably disposed in the bumper 16 between a locking position and an unlocking position. The second end of the linking module is connected to the latching module 34.

The button 32 can be pressed and is disposed in the button hole 140, driving the first end of the linking module 31 to move the second end of the linking module 31, corresponding to the locking position and the unlocking position of the latching module 34.

The linking module 31 of the present embodiment includes a upper rod movably disposed on the inner side of the side board 14 (refer to label 311 to 314 in FIG. 3), a lower rod 317 for driving the latching module 34, and a connection rod 316. The two ends of the connection rod 316 are respectively pivoted on the upper rod 311 and the lower rod 317.

In the present embodiment, the direction of the upper rod is generally parallel to the direction of the long side on the side board 14. The direction of the lower rod 317 is generally perpendicular to the upper rod and the bottom board 12. The direction of the latching module 34 is generally parallel to the bottom board 12 and perpendicular to the lower rod 317. To facilitate description, define the direction along the latching module as the x-direction, the direction along the lower rod 317 as the y-direction, and the direction along the upper rod as the z-direction.

To properly fix the linking module 31, the side board 14 of the present embodiment is formed with an upper clamping plate 141, a lower clamping plate 142, and a pair of restrictive plates 144 proximal to the bumper 16. The upper clamping plate 141 and the lower clamping plate 142 extend from the inner side of the side board 14 toward the inner portion of the housing 10 in a direction generally parallel to the bottom board 12, namely parallel to the x-z plane. The pair of restrictive plates 144 extend from the inner side of the side board 14 toward the inner portion of the housing 10, in a direction generally perpendicular to the bottom board 12, namely parallel to the x-y plane. The upper rod (refer to labels 311 to 314 in FIG. 3) is disposed between the upper clamping plate 141 and the lower clamping plate 142. The lower rod 317 is disposed between the pair of restrictive plates 144. The lower clamping plate 142 extend toward the pair of restrictive plates 144 to form a slanted guiding plate 1421 abutting one end of the connection rod 316.

In the present embodiment, the upper rod includes a drive section 311, a pivot section 313, and a midsection 312 between the drive section 311 and the pivot section 313. The three sections form a straight line, generally along the z-direction. The drive section 311 is formed with a through hole 3110 and a slanted face 3111 facing the through hole 3110. The button 32 has a trigger block 321 extending to the inner side of the side board 14. The trigger block 321 is formed with a slanted trigger face 3210 and is disposed inside the through hole 3110. The slanted trigger face 3210 abuts the slanted face 3111. The upper rod includes a spring 314 sleeved on the midsection 312.

The inner side of the side board 14 of the present embodiment is formed with blocking loop 143 positioned between the lower clamping plate 142 and the button hole 140. The end of the midsection 312 proximal to the drive section 311 is disposed within the blocking loop 143. The two ends of the spring 314 respectively abut the blocking loop 143 and the pivot section 313. The connection rod 316 is connected to and pivots about one end of the upper rod (namely the pivot section 313), and rotates along the inner side of the side board 14. Namely, the connection rod 316 rotates on the y-z plane.

In the present embodiment, a flexible string 318 is connected between the lower rod 317 and the latching module 34. The latching module 34 includes a latching beam 341, a pivot rod 342 extending from the latching beam 341, and a spring 343 sleeved on the pivot rod 342. A guiding base 344 is disposed on the bumper 16, the pivot rod 342 passes through the guiding base 344 and connects to the string 318, and the two ends of the spring 343 respectively abut the latching beam 341 and the guiding base 344. The latching beam 341 is movably disposed in the bumper 16. Normally, the latching beam 341 partially protrudes from the bumper 16. The bumper 16 includes a turning-point base. The string 318 slideably passes through the turning-point base. In the present embodiment, the turning-point base includes a pair of frames 162 fixed on the bumper 16 and a turning shaft 163. The string 318 passes around the turning shaft 163.

Figure 4:
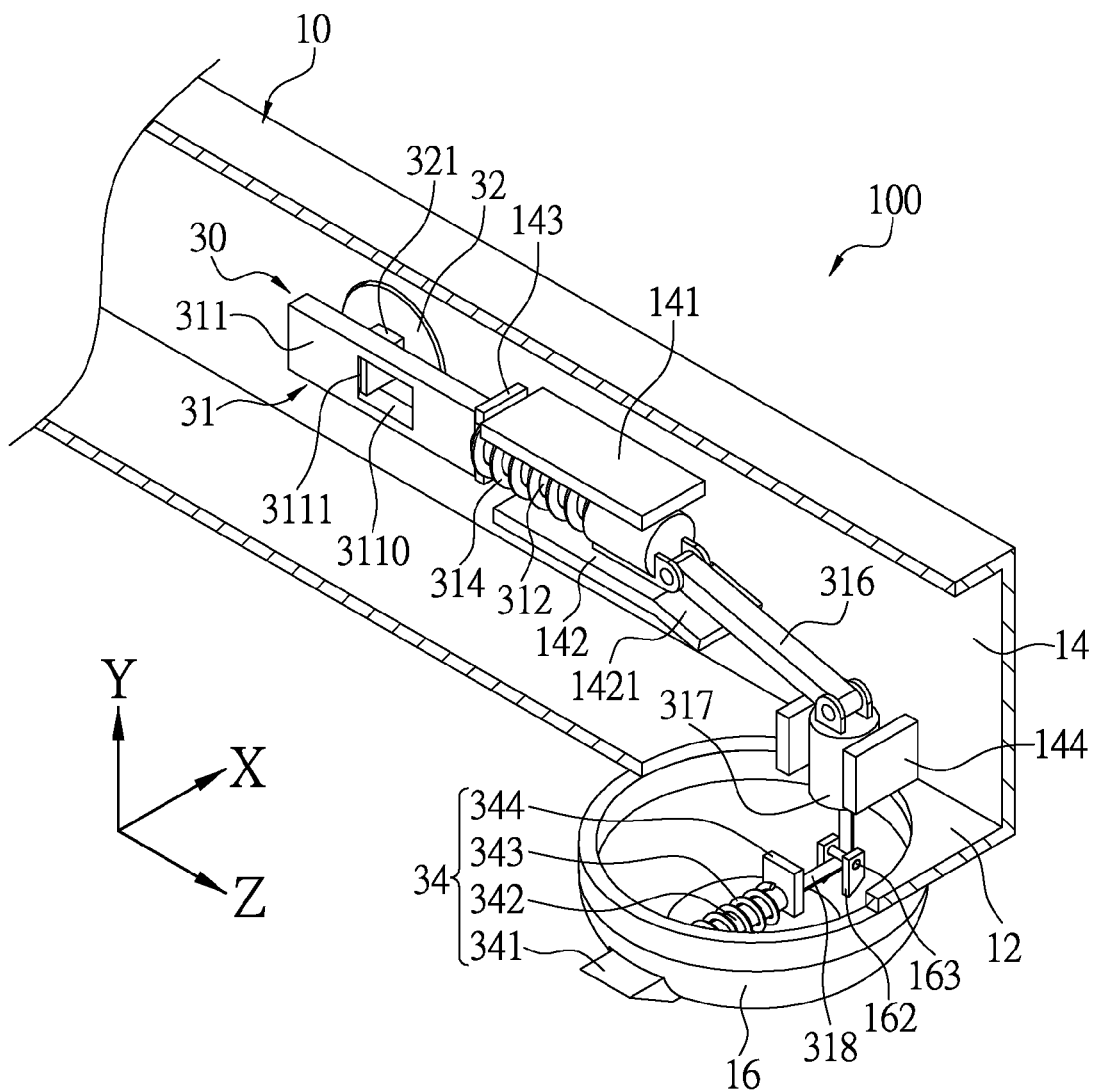
FIG. 4 shows a partial perspective view of an electronic device with a latching bumper in a locking position according to the first embodiment of the present disclosure.
Figure 5:
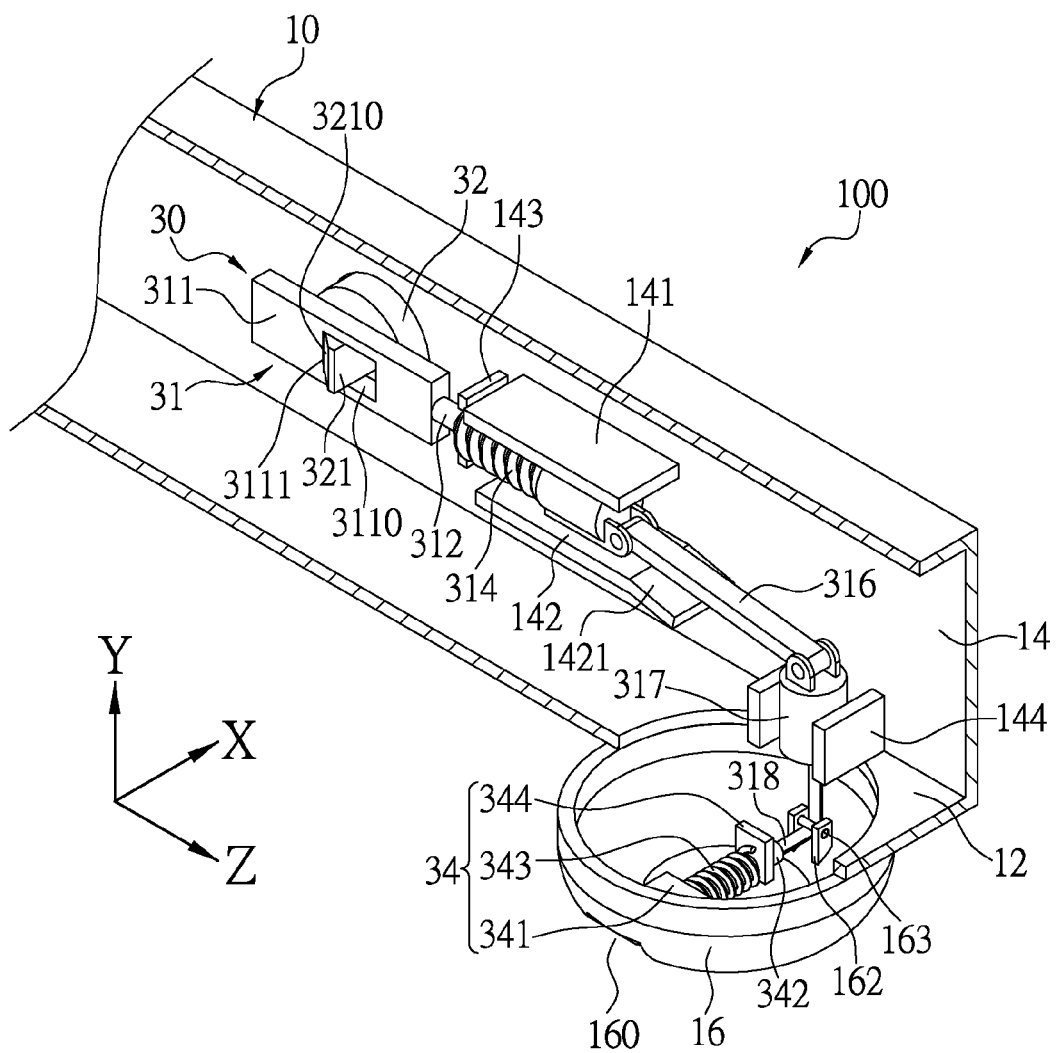
FIG. 5 shows a partial perspective view of an electronic device with a latching bumper in an unlocking position according to the first embodiment of the present disclosure.

FIG. 4 and FIG. 5 are partial perspective views of an electronic device with a latching bumper according to the present disclosure respectively in a locking position and an unlocking position. Given that the slanted trigger face 3210 of the button 32 abuts against the slanted face, when the button 32 moves from a non-pressed position of FIG. 4 to a pressed position of FIG. 5, the upper rod (refer to labels 311 to 314) moves along the z-axis further away from the latching module. The connection rod 316 rotates along the inner side of side board 14 and about one end of the pivot section 313. Due to the slanted guiding plate of the lower clamping plate 142, the end of the connection rod 315 proximal to the latching module 34 is raised, and pulls the lower rod 317 upward as shown in FIG. 5. At this moment, the upper rod stores a restoring force because the spring 314 is being blocked by the blocking loop 143.

As shown in FIG. 5, the string 318 pulls on the latching module 34, namely pulling on the pivot rod 342 and the latching beam 341 such that the latching beam 341 is drawn into the bumper 16. The spring 343 is blocked by the guiding base 344 and pressed to store a restoring force. At this moment, the user can lift the electronic device 100 with latching bumper away from the second electronic device 100'. This method of operation allows the user to hold the housing 10 and complete the unlocking in one process, and is very intuitive.

After releasing the buttons 32, due to the spring force provided by the spring 314 of the upper rod and the spring 343 of the latching module 34, the linking module returns to non-pressed state as shown in FIG. 4.

The present embodiment houses the latching module 34 within the bumper 16, saving space in the housing 10 and providing a concealed appearance. When the electronic device with a latching bumper is placed on a table, no awkward protrusion is visually noticeable.

Second Embodiment

Figure 6:
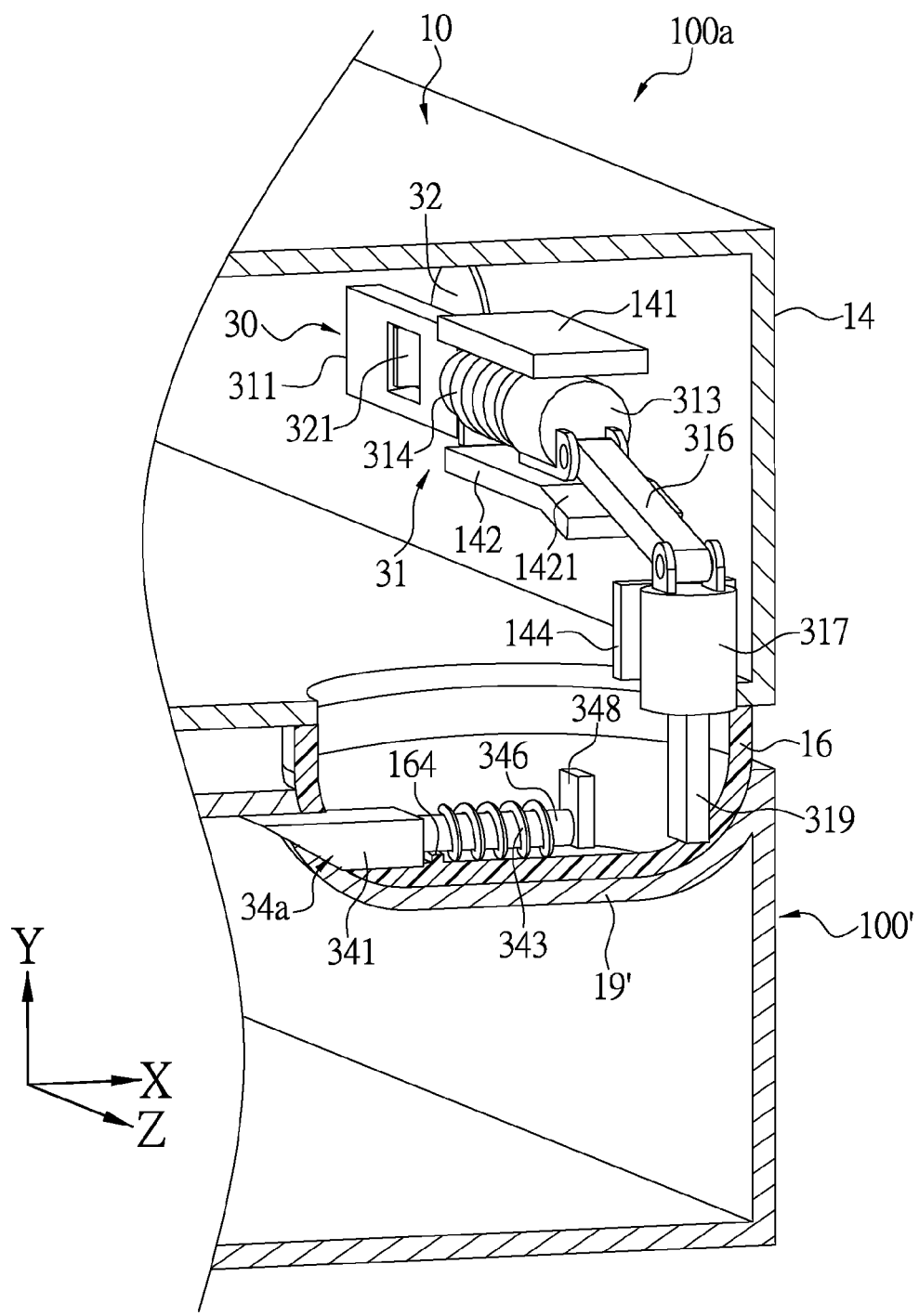
FIG. 6 shows a partial exploded perspective view of an electronic device with a latching bumper according to the second embodiment of the present disclosure.

Referring to FIG. 6, the present embodiment differs from the first embodiment in that the electronic device 100 with a latching bumper replaces the string 318 with magnetic units. The lower rod 317 and the latching module 34a are respectively connected to two magnetic units 319, 348 which repel each other. The latching module 34a includes a latching beam 341, a pivot rod 346 extending from the latching beam 341, and a spring 343 sleeved on the pivot rod 341. The magnetic unit 348 is fixed on one end of the pivot rod 346. The bumper 16 has a protruding block 164 positioned below the pivot rod 348 and proximal to the latching beam 341. The two ends of the spring 343 respectively abut the magnetic unit 348 and the protruding block 164, and store a spring force under the normal locking position.

Figure 7:
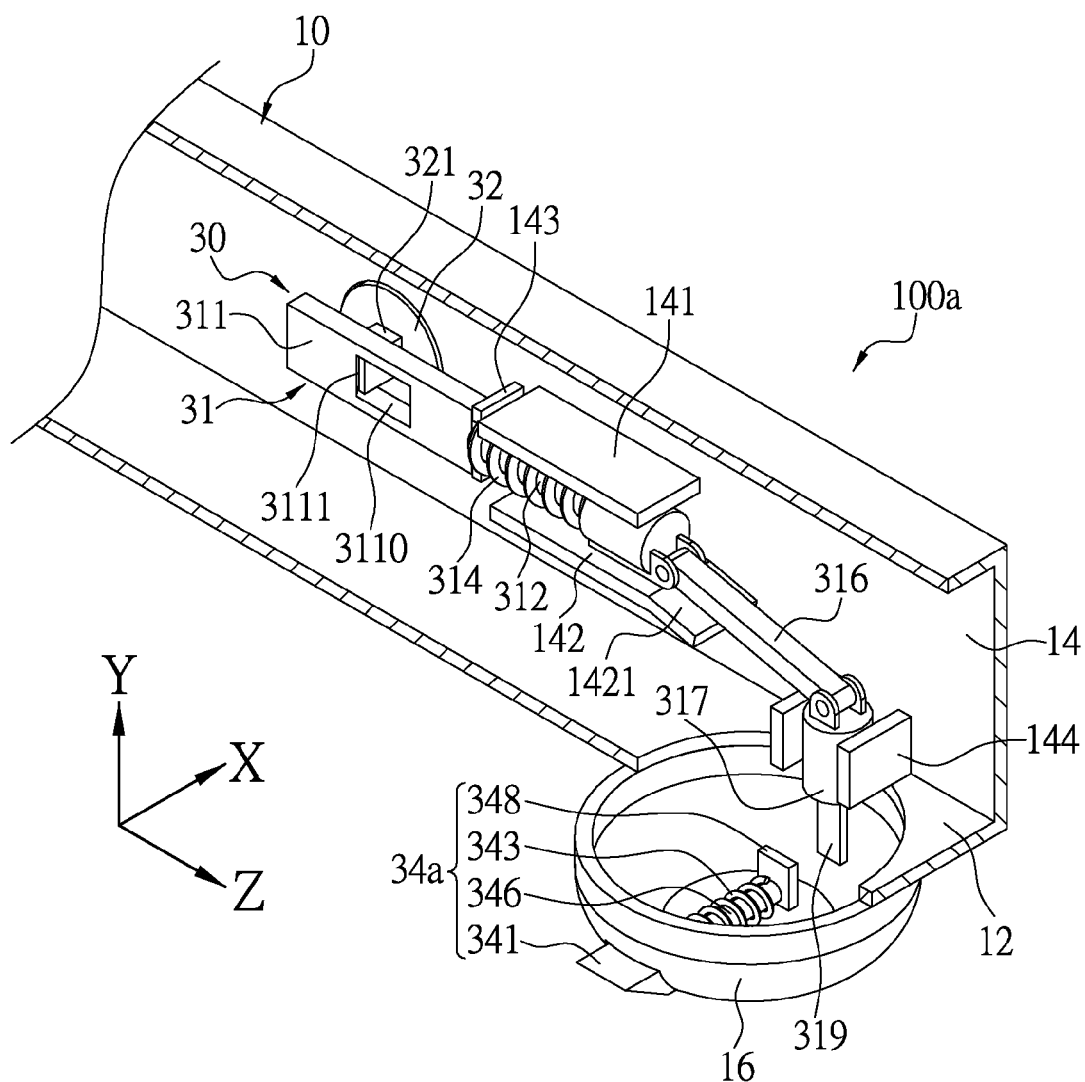
FIG. 7 shows a partial perspective view of an electronic device with a latching bumper in a locking position according to the second embodiment of the present disclosure.
Figure 8:
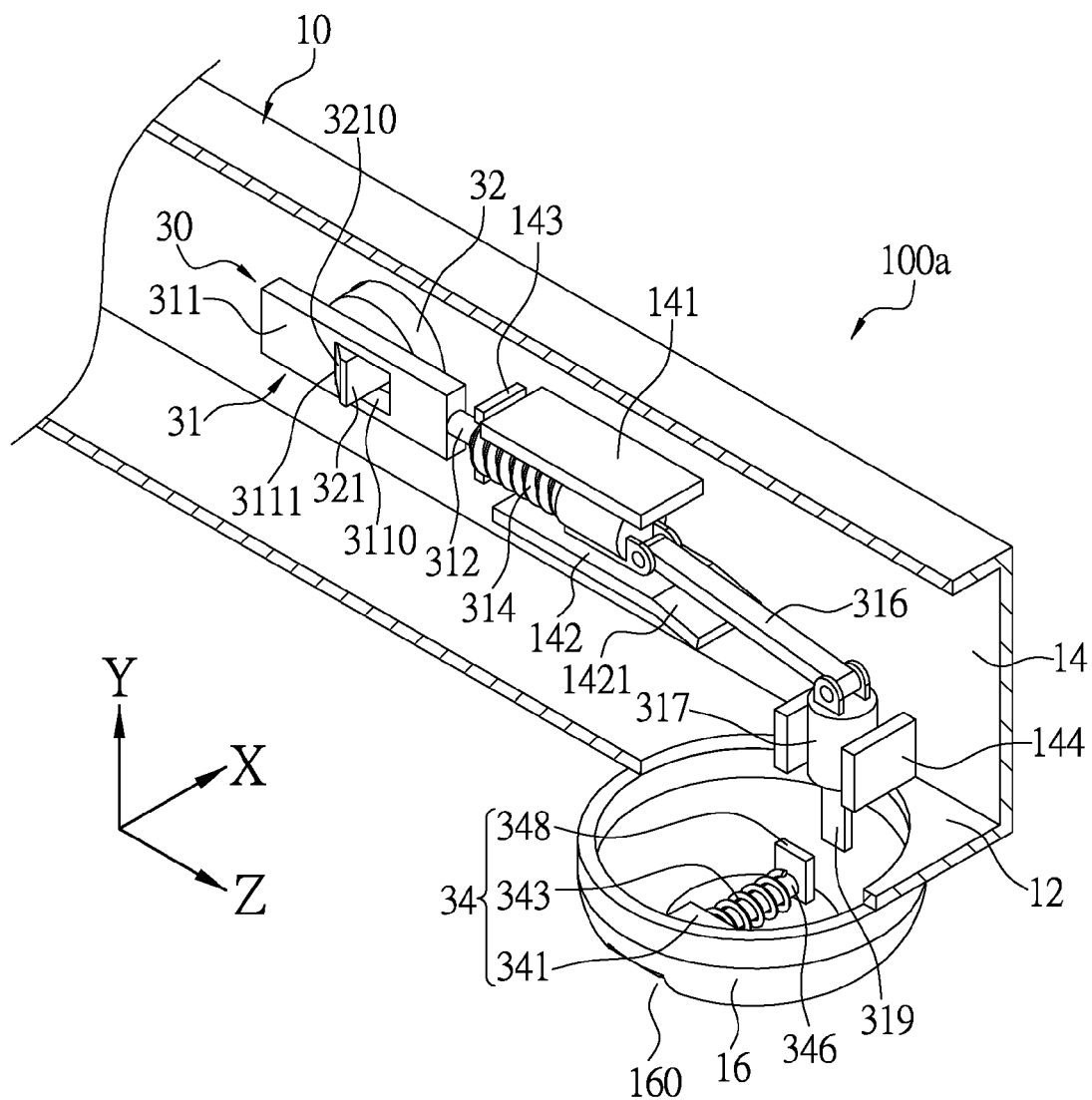
FIG. 8 shows a partial perspective view of an electronic device with a latching bumper in an unlocking position according to the second embodiment of the present disclosure.

FIG. 7 shows a partial perspective view of the second embodiment at the locking position. After the user presses on the button 32, similar to the first embodiment, the lower rod 317 of the linking module 31 moves upward, and the magnetic unit 319 of the lower rod 317 moves away from the magnetic unit 348 of the latching module 34. At this moment, the repulsive force between the two repelling magnetic units 319, 348 disappears; therefore due to the spring force of the spring 343, the latching module 34a is pushed toward the inner portion of the bumper 16. Namely, the latching beam 341 is drawn into the bumper 16 to present an unlocking position as shown in FIG. 8. The user can lift the electronic device 100a with a latching bumper, and the bumper 16 can detach from the latching depressions 19' of the second electronic device 100'.

Under the normal locking state, the electronic device 100 with a latching bumper is fixed to the second electronic device 100', so the electrical connector 20 do not accidentally detach from the dock 110'. Similar to the first embodiment, if the electronic device 100 has the appropriate dimensions, the user can press the button 32 and complete the process of unlocking while holding onto the housing 10, resulting in an intuitive operation.

Figure 9:
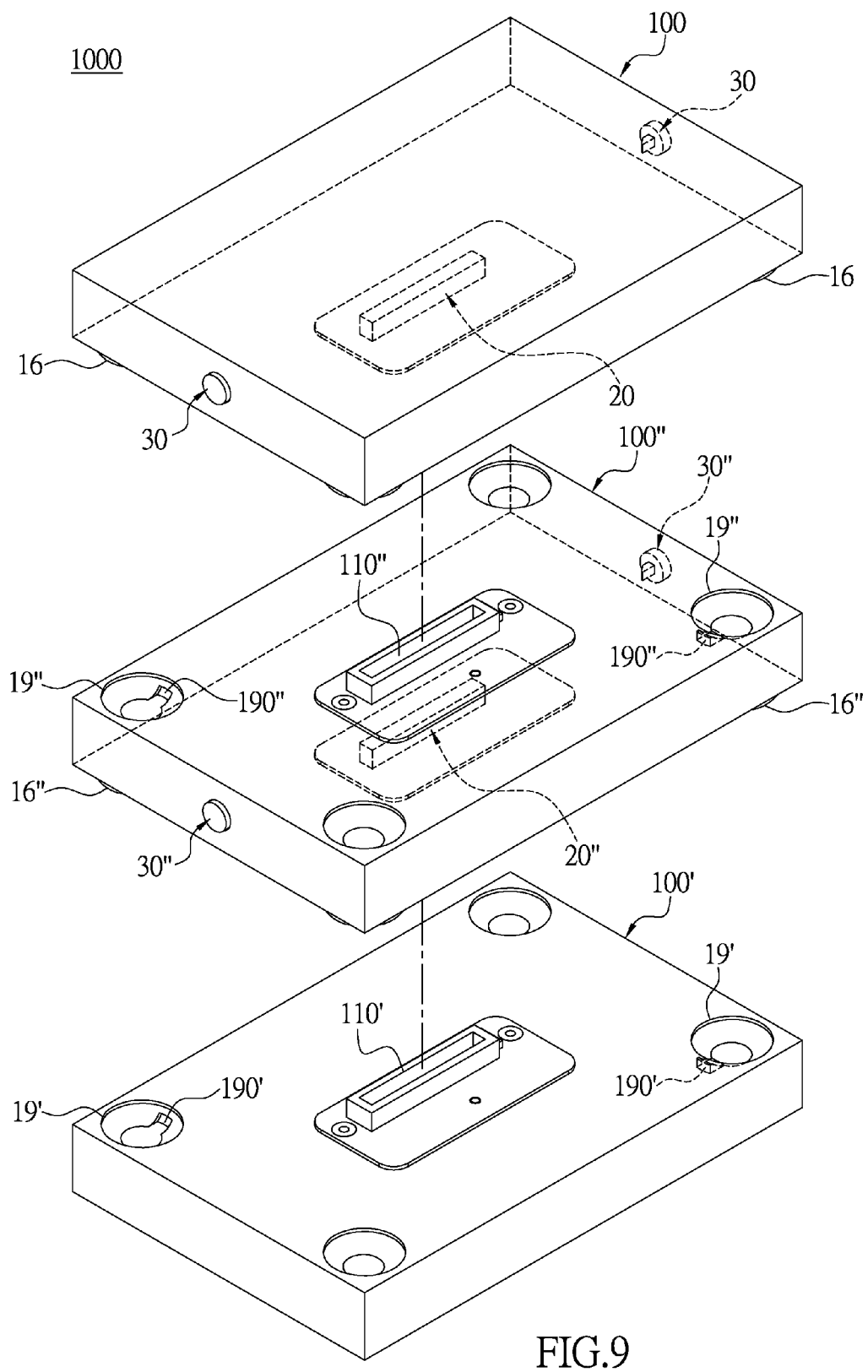
FIG. 9 shows a schematic diagram of a stackable electronic device system in another state of use according to the present disclosure.

Referring to FIG. 9, in supplemental note, the present disclosure can add a third electronic device 100" whose top surface has a latching depression 19", engagement hole 190" and docket 110", by which the electronic device 100 can be stacked on top of the third electronic device 100". The present disclosure can form a stackable electronic device system 1000, which includes three electronic devices 100, 100', 100". Relative to FIG. 1, the present embodiment adds a third electronic device 100" in the middle, which includes not only an electrical connector 20" and latching mechanism 30", but also the latching depression 19", the engagement hole 190", and the dock 110" on its top surface. By this configuration, the electronic device 100 can be stacked on top of the third electronic device 100", which in turn can be stacked on top of the second electronic device 100' by using the bumpers 16". Inferentially, the present disclosure can include more than a third electronic device 100", and can stack more than three electronic devices together. In other words, the third electronic device 100" can be considered as an alteration of the second electronic device.

The descriptions illustrated supra set forth simply the preferred embodiments of the present disclosure; however, the characteristics of the present disclosure are by no means restricted thereto. All changes, alternations, or modifications conveniently considered by those skilled in the art are deemed to be encompassed within the scope of the present disclosure delineated by the following claims.

What is claimed is:

1. A latching bumper, disposed in a housing of an electronic device having a side board, comprising:
    a bumper, formed with a latching hole; and
    a latching mechanism, including
        a linking module disposed in the housing, and having a first end extending to the side board and a second end extending into the bumper;
        a latching module movably disposed in the bumper between a locking position protruding from the latching hole and an unlocking position drawn into the bumper, wherein the second end of the linking module is connected to the latching module; and
        a button, pressably disposed on the side board so as to drive the first end of the linking module to move the second end of the linking module, corresponding to the locking position and the unlocking position of the latching module.

2. The latching bumper according to claim 1, wherein the linking module includes an upper rod movably disposed on the inner side of the side board, a lower rod for driving the latching module, and a connection rod whose two ends are respectively pivotally connected to the upper rod and the lower rod.

3. The latching bumper according to claim 2, wherein the upper rod includes a drive section, a pivot section, and a midsection positioned between the drive section and the pivot section, the button has a trigger block extending to the inner side of the side board, the trigger block is formed with a slanted trigger face, the drive section is formed with a through hole and a slanted face facing the through hole, the trigger block is disposed in the through hole, and the slanted trigger face abuts the slanted face.

4. The latching bumper according to claim 2, wherein the connection rod is connected to and pivots about one end of the upper rod, to rotate along the inner side of the side board.

5. The latching bumper according to claim 2, wherein the lower rod and the latching module have a flexible string connected there-between.

6. The latching bumper according to claim 5, wherein the latching module includes a latching beam, a pivot rod extending from the latching beam, and a spring sleeved on the pivot rod, the bumper has a guiding base, the pivot rod passes through the guiding base and is connected to the string, and the two ends of the spring respectively abut the latching beam and the guiding base.

7. The latching bumper according to claim 6, wherein the bumper includes a turning-point base positioned below the lower rod, the string slides on the turning-point base, and the turning-point base has two frames fixed on the bumper and a turning shaft.

8. The latching bumper according to claim 2, wherein the lower rod and the latching module each have a magnetic unit and the magnetic units repel each other.

9. The latching bumper according to claim 8, wherein the latching module includes a latching beam, a pivot rod extending from the latching beam, and a spring sleeved on the pivot rod, the magnetic unit is fixed on one end of the pivot rod, the bumper has a protruding block positioned below the pivot rod proximal to the latching beam, and the two ends of the spring respectively abut the magnetic unit and the protruding block.

10. An electronic device with a latching bumper, comprising:
    a housing having a bottom board, a side board connected to the bottom board, and a bumper disposed on the bottom board, wherein the side board is formed with a button hole, and the bumper is formed with a latching hole; and
    a latching mechanism, which has:
        a linking module, disposed on the inner side of the side board, and having a first end extending to the button hole and a second end extending into the bumper;
        a latching module movably disposed in the bumper between a locking position protruding from the latching hole and an unlocking position drawn into the bumper, wherein the second end of the linking module is connected to the latching module; and
        a button, which can be pressed and is disposed in the button hole, for driving the first end of the linking module to move the second end of the linking module, corresponding to the locking position and the unlocking position of the latching module.

11. The electronic device with a latching bumper according to claim 10, wherein the linking module includes an upper rod movably disposed on the inner side of the side board, a lower rod for driving the latching module, and a connection rod whose two ends are respectively pivotally connected to the upper rod and the lower rod.

12. The electronic device with a latching bumper according to claim 11, wherein the side board is formed with an upper clamping plate, a lower clamping plate, and two restrictive plates proximal to the bumper, the upper rod is disposed between the upper clamping plate and the lower clamping plate, the lower rod is disposed between the two restrictive plates, the lower clamping plate has a slanted plate extending toward the two restrictive plates, and one end of the connection rod abuts the slanted guiding plate.

13. The electronic device with a latching bumper according to claim 12, wherein the upper rod includes a drive section, a pivot section, and a midsection positioned between the drive section and the pivot section, the button has a trigger block extending to the inner side of the side board, the trigger block is formed with a slanted trigger face, the drive section is formed with a through hole and a slanted face facing the through hole, the trigger block is disposed in the through hole, and the slanted trigger face abuts the slanted face.

14. The electronic device with a latching bumper according to claim 13, wherein the upper rod includes a spring sleeved on the midsection, the inner side of the side board is formed with a blocking loop positioned between the lower clamping plate and the button hole, the end of the midsection proximal to the drive section is disposed in the blocking loop, and the two ends of the spring respectively abut the blocking loop and the pivot section.

15. The electronic device with a latching bumper according to claim 11, wherein the connection rod is connected to and pivots about one end of the upper rod, to rotate along the inner side of the side board.

16. The electronic device with a latching bumper according to claim 11, wherein the lower rod and the latching module have a flexible string connected there-between.

17. The electronic device with a latching bumper according to claim 16, wherein the latching module includes a latching beam, a pivot rod extending from the latching beam, and a spring sleeved on the pivot rod, the bumper has a guiding base, the pivot rod passes through the guiding base and is connected to the string, and the two ends of the spring respectively abut the latching beam and the guiding base.

18. The electronic device with a latching bumper according to claim 17, wherein the bumper includes a turning-point base positioned below the lower rod, the string slides on the turning-point base, and the turning-point base has two frames fixed on the bumper and a turning shaft.

19. The electronic device with a latching bumper according to claim 11, wherein the lower rod and the latching module each have a magnetic unit and the magnetic units repel each other.

20. The electronic device with a latching bumper according to claim 19, wherein the latching module includes a latching beam, a pivot rod extending from the latching beam, and a spring sleeved on the pivot rod, the magnetic unit is fixed on one end of the pivot rod, the bumper has a protruding block positioned below the pivot rod proximal to the latching beam, and the two ends of the spring respectively abut the magnetic unit and the protruding block.

21. The electronic device with a latching bumper according to claim 10, wherein the bottom board has a plurality of bumpers, each of two bumpers on a diagonal line between two corners has a latching module of the latching mechanism.

22. A stackable electronic device system, comprising:
a first electronic device, which includes a housing, an electrical connector disposed on the top surface of the housing, at least one bumper disposed on the bottom surface of the housing, and at least one latching mechanism disposed in the housing and extending into the bumper, wherein each of the bumpers is formed with a latching hole;
wherein each of the latching mechanisms includes:
a linking module, disposed in the housing, and having a first end proximal to the housing and a second end extending into the bumper;
a latching module movably disposed in the bumper between a locking position protruding from the latching hole and an unlocking position drawn into the bumper, wherein the second end of the linking module is connected to the latching module; and
a button, which can be pressed and is disposed on the side board, for driving the first end of the linking module to move the second end of the linking module, corresponding to the locking position and the unlocking position of the latching module;
at least a second electronic device, which includes a housing, a dock disposed on the top surface of the housing, at least one latching depression disposed on the top surface of the housing, at least one bumper disposed on the bottom surface of the housing, wherein each of the latching depression is formed with an engagement hole;
wherein the latching mechanism of the first electronic device can selectively protrude from the latching hole of the bumper and engage with the engagement hole of the latching depression of the second electronic device.

23. The stackable electronic device system according to claim 22, wherein the second electronic device includes at least one of the latching mechanism disposed in the housing and extending into the bumper, the bumper of the second electronic device is formed with a latching hole, and one end of the latching mechanism extends into the bumper.

24. The stackable electronic device system according to claim 23, wherein the second electronic device includes an electrical connector on the bottom surface of the housing.

* * * * *